US011691699B2

(12) United States Patent
Lorman (10) Patent No.: US 11,691,699 B2
(45) Date of Patent: Jul. 4, 2023

(54) FIELD-CONFIGURABLE AND MODULAR NAVIGATIONAL SYSTEM FOR AUTONOMOUS VEHICLE

(71) Applicant: ThayerMahan, Inc., Groton, CT (US)

(72) Inventor: Alexander Lorman, Mystic, CT (US)

(73) Assignee: THAYERMAHAN, INC., Groton, CT (US)

( * ) Notice: Subject to any disclaimer, the term of this patent is extended or adjusted under 35 U.S.C. 154(b) by 300 days.

(21) Appl. No.: 16/872,620

(22) Filed: May 12, 2020

(65) Prior Publication Data

US 2020/0363537 A1  Nov. 19, 2020

Related U.S. Application Data

(60) Provisional application No. 62/847,212, filed on May 13, 2019.

(51) Int. Cl.
*B63B 49/00* (2006.01)
*G01S 19/41* (2010.01)
*G06F 30/331* (2020.01)
*G01S 19/42* (2010.01)
*B60W 60/00* (2020.01)

(52) U.S. Cl.
CPC .............. *B63B 49/00* (2013.01); *G01S 19/41* (2013.01); *G01S 19/426* (2013.01); *G06F 30/331* (2020.01); *B60W 60/0011* (2020.02)

(58) Field of Classification Search
CPC ... B63B 49/00; B63B 2035/006; G01S 19/41; G01S 19/426; G01S 19/35; G01S 19/43; G01S 19/47; G06F 30/331; B60W 60/0011
See application file for complete search history.

(56) References Cited

U.S. PATENT DOCUMENTS

| 8,165,795 | B2 | 4/2012 | Debailleul |
| 2008/0221794 | A1 | 9/2008 | Debailleul |
| 2012/0086598 | A1 | 4/2012 | Aghili |

FOREIGN PATENT DOCUMENTS

| WO | WO-02086533 A2 | 10/2002 | |
| WO | WO-2006061403 A1 | 6/2006 | |
| WO | WO-2017004419 A1 * | 1/2017 | ................ B60F 5/00 |

OTHER PUBLICATIONS

SeaVax, Low Cost Computer Navigation, 2015 (Year: 2015).*
Guo, Hang, et al. "Kalman filtering for GPS/magnetometer integrated navigation system." Advances in Space Research 45.11 (2010): 1350-1357. (Year: 2010).*
Zhao, Minghui, et al. "Method for improving positioning accuracy by using double low-precision GPS." 2018 International Symposium in Sensing and Instrumentation in IoT Era (ISSI). IEEE, 2018. (Year: 2018).*
Arduino, Wikipedia (Year: 2019).*
Arduino Mega, Arduino, 2022 (Year: 2022).*
Adafruit GPS breakout, Adafruit (Year: 2022).*

* cited by examiner

*Primary Examiner* — Alan D Hutchinson
(74) *Attorney, Agent, or Firm* — Wilson Sonsini Goodrich & Rosati (57) ABSTRACT

Described are navigational systems for vehicles including modular, field-swappable and field-configurable components and a plurality of operational modes.

26 Claims, 5 Drawing Sheets

Diagram showing the field-swap capability of various daughterboards.

Fig. 1: Diagram showing major components of the navigational system.

Fig. 2: Diagram showing the field-swap capability of various daughterboards.

Fig. 3: An exemplary configuration showing two GPS daughterboards and an IMU.

Fig. 4: An exemplary configuration showing two GPS daughterboards.

Fig. 5: An exemplary configuration showing an IMU and a single GPS daughterboard.

FIELD-CONFIGURABLE AND MODULAR NAVIGATIONAL SYSTEM FOR AUTONOMOUS VEHICLE

CROSS-REFERENCE TO RELATED APPLICATIONS

This application claims the benefit of U.S. Provisional Application No. 62/847,212, filed on May 13, 2019, entitled "Field-Configurable and Modular Navigational System for Autonomous Vehicle," the contents of which are incorporated herein by reference for all purposes.

BACKGROUND

Long range and duration sensor data capture excursions are commonly used by military, paramilitary, research, aid, and construction efforts. Sensor data is often collected therein through custom or semi-custom capture and logging devices. However, the design of such systems to enable the required ranges and durations is often expensive and labor intensive.

SUMMARY

Provided herein are navigation systems for low power vehicles and long duration data logging. The systems here employ a user-serviceable modular architecture to enable mission-specific low-power configurations. The systems herein facilitate deployment of a vehicle continuously, for long, uninterrupted periods of time, under severe conditions. Further, the systems herein are configured such that its components can be easily removed, replaced, and/or bypassed to further enable continuous operation even in the event of hardware failure. For example, the systems provided herein include multiple operational modes, spanning various levels of complexity, utilizing various hardware components. If and when a hardware component fails, the disclosed systems degrade gracefully to alternative operational modes to make use of the available hardware configurations. Such robust failover options enable continuous vehicle operation over large distances and periods of time, even without human operator intervention.

In one aspect, disclosed herein are navigational systems for a vehicle comprising: a backplane comprising ports for hosting a plurality of daughterboards and a data connection for receiving data from an inertial measurement unit (IMU); a modular microcontroller daughterboard comprising a non-volatile storage; a first modular daughterboard comprising a GPS receiver; and a second modular daughterboard comprising a GPS receiver; wherein the backplane is dynamically field-configurable to alter the data connections between the first and second modular daughterboards the data connections between the first and second modular daughterboards and the modular microcontroller daughterboard; and wherein the system provides a plurality of operational modes, wherein the system is field-configurable to switch between operational modes based on remote or programmatic triggers, the plurality of operational modes comprising two, three, four, five, or all of the following: a first single GPS positioning mode; a second single GPS positioning mode, wherein a magnetometer of the IMU is utilized to determine heading; a differential GPS (dGPS) positioning mode; a single GPS RTK positioning mode, wherein the microcontroller daughterboard has communication with an external receiver to receive computer real-time kinematic (RTK) fixes; a first dual-receiver GPS RTK positioning mode, wherein the microcontroller daughterboard has communication with a self-contained RTK receiving system, and wherein a moving baseline system is established; and a second dual-receiver GPS RTK positioning mode, wherein the microcontroller daughterboard has communication with a RTK system, and wherein the IMU is utilized to supplement the RTK heading by using Kalman filters and high-rate inertial data. In some embodiments, the vehicle is an unmanned vehicle. In further embodiments, the unmanned vehicle is a maritime vehicle. In still further embodiments, the unmanned maritime vehicle is a long endurance vehicle. In a particular embodiment, the unmanned maritime vehicle is a surface vehicle. In other embodiments, the vehicle is a terrestrial vehicle. In some embodiments, the backplane is implemented as a printed circuit board (PCB). In some embodiments, the modular microcontroller daughterboard and the non-volatile storage are removable and user-swappable. In some embodiments, the first modular daughterboard is removable and user-swappable. In some embodiments, the second modular daughterboard is removable and user-swappable. In some embodiments, the system further comprises an IMU. In further embodiments, the IMU is removable and user-swappable. In some embodiments, the first single GPS positioning mode comprises local logging or output to a host system. In some embodiments, the first single GPS positioning mode utilizes assisted GPS (aGPS). In other embodiments, the first single GPS positioning mode utilizes non-assisted GPS. In some embodiments, the second single GPS positioning mode comprises local logging or output to a host system. In some embodiments, the second single GPS positioning mode utilizes aGPS. In other embodiments, the second single GPS positioning mode utilizes non-assisted GPS. In some embodiments, the dGPS positioning mode comprises local logging or output to a host system. In some embodiments, the dGPS positioning mode utilizes aGPS. In other embodiments, the dGPS positioning mode utilizes non-assisted GPS. In some embodiments, the single GPS RTK positioning mode comprises local logging or output to a host system. In some embodiments, the first dual-receiver GPS RTK positioning mode comprises local logging or output to a host system. In some embodiments, the second dual-receiver GPS RTK positioning mode comprises local logging or output to a host system. In some embodiments, the system further comprises one or more built-in antennas integral to the system. In some embodiments, the system further comprises one or more external antennas. In some embodiments, the system further comprises an ambient temperature sensor. In some embodiments, the system further comprises an ambient pressure sensor. In some embodiments, the system is implemented as a self-contained unit comprising means for mounting to the vehicle. In some embodiments, the backplane further comprises a high-efficiency power supply configured to power the navigational system for about 2 days to about 300 days of continuous operation. In further embodiments, the system operates on a power budget of less than 0.05 amperes at 5 volts.

BRIEF DESCRIPTION OF THE DRAWINGS

A better understanding of the features and advantages of the present subject matter will be obtained by reference to the following detailed description that sets forth illustrative embodiments and the accompanying drawings of which.

DETAILED DESCRIPTION

Described herein, in certain embodiments, are navigational systems for a vehicle comprising: a backplane comprising ports for hosting a plurality of daughterboards and a data connection for receiving data from an inertial measurement unit (IMU); a modular microcontroller daughterboard comprising a non-volatile storage; a first modular daughterboard comprising a GPS receiver; and a second modular daughterboard comprising a GPS receiver; wherein the backplane is dynamically field-configurable to alter the data connections between the first and second modular daughterboards the data connections between the first and second modular daughterboards and the modular microcontroller daughterboard; and wherein the system provides a plurality of operational modes, wherein the system is field-configurable to switch between operational modes based on remote or programmatic triggers, the plurality of operational modes comprising two, three, four, five, or all of the following: a first single GPS positioning mode; a second single GPS positioning mode, wherein a magnetometer of the IMU is utilized to determine heading; a differential GPS (dGPS) positioning mode; a single GPS RTK positioning mode, wherein the microcontroller daughterboard has communication with an external receiver to receive computer real-time kinematic (RTK) fixes; a first dual-receiver GPS RTK positioning mode, wherein the microcontroller daughterboard has communication with a self-contained RTK receiving system, and wherein a moving baseline system is established; and a second dual-receiver GPS RTK positioning mode, wherein the microcontroller daughterboard has communication with a RTK system, and wherein the IMU is utilized to supplement the RTK heading by using Kalman filters and high-rate inertial data.

The navigation systems herein employ a user-serviceable modular architecture to enable mission-specific low-power configurations. The systems herein can be used for unattended vehicular field for long uninterrupted periods of time. Further, the systems herein are configured such that its components can be easily removed, replaced, and/or bypassed to further enable continuous operation operate even upon hardware failure. For example, if an operational mode requires two GPS elements, and one GPS element fails, the systems herein allow for automatic default to a suboptimal operational mode which employs only the one working GPS element. Similarly degraded modes can be employed if an inertial measurement unit (IMU) fails. Such rugged failover enables continuous vehicle operation over large distances and periods of time, even without human operator intervention.

Certain Definitions

Unless otherwise defined, all technical terms used herein have the same meaning as commonly understood by one of ordinary skill in the art to which the present subject matter belongs. As used in this specification and the appended claims, the singular forms "a," "an," and "the" include plural references unless the context clearly dictates otherwise. Any reference to "or" herein is intended to encompass "and/or" unless otherwise stated.

As used herein, the term "about" refers to an amount that is near the stated amount by 10%, 5%, or 1%, including increments therein.

As used herein, the term "about" in reference to a percentage refers to an amount that is greater or less the stated percentage by 10%, 5%, or 1%, including increments therein.

As used herein, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

Navigational System

In some embodiments, per FIGS. 1-5, the navigational systems for a vehicle comprises a backplane 100, a modular microcontroller daughterboard 105, a first modular daughterboard 110A, and a second modular daughterboard 110B. The systems can provide a plurality of operational modes. The systems can be field-configurable to switch between operational modes based on remote or programmatic triggers. The systems can function under low power and for long durations. The systems can employ a user-serviceable modular architecture to enable mission-specific low-power configurations.

In some embodiments, the system further comprises one or more antenna connectors 115 for an antenna. In some embodiments, the system comprises 1, 2, 3, 4, 5, 6, 7, 8, 9, 10, or more antenna connectors 115. In some embodiments, the system further comprises one or more built-in antennas integral to the system. In some embodiments, the system further comprises one or more external antennas. In some embodiments, at least one of the first modular daughterboard 110A and the second modular daughterboard 110B comprises the antenna connector 115.

In some embodiments, the system further comprises one or more USB connectors 120. In some embodiments, the system further comprises one or more external power inputs 125. In some embodiments, the system further comprises an IMU 300. In further embodiments, the IMU 300 is removable. In further embodiments, the IMU 300 is user-swappable.

In some embodiments, the system further comprises an ambient temperature sensor. In some embodiments, the system further comprises an ambient pressure sensor. In some embodiments, the system is implemented as a self-contained unit comprising means for mounting to the vehicle. In further embodiments, the system operates on a power budget of less than 0.05 amperes at about 5 volts. In further embodiments, the system operates on a power budget of less than 0.05, 0.1, 0.2, 0.5, 0.75, or 1 ampere at about 5 volts, including increments therein. In further embodiments, the system operates on a power budget of less than 0.05 amperes at about 10, 9, 8, 7, 6, 5, 4, 3, 2, or 1 volt(s), including increments therein.

The backplane 100 can comprise a mounting hole 130. The backplane 100 can comprise 1, 2, 3, 4, 5, 6, 7, 8, 9, 10, or more mounting holes 130. The modular microcontroller daughterboard can comprise a non-volatile storage. The first modular daughterboard 110A can comprise a GPS receiver. The second modular daughterboard 110B can comprise a GPS receiver.

Figure 1:
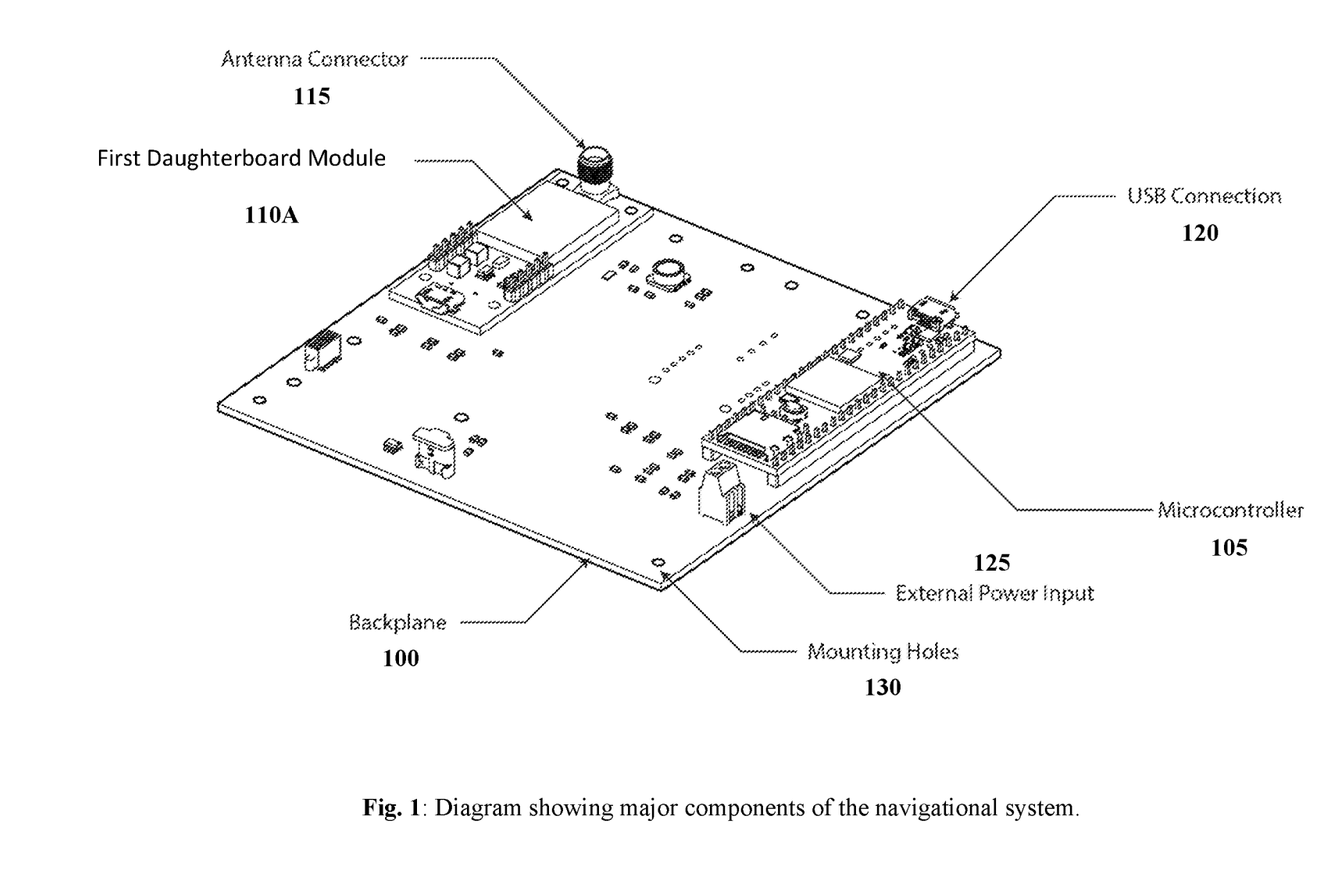
FIG. 1 shows a non-limiting exemplary illustration of a navigational system described herein depicting major components of the navigational system.

Per FIG. 1, in one example the navigational system consists of a backplane 100, a modular microcontroller daughterboard 105, an antenna connector 115, a USB connector 120, and an external power input 125, and a first modular daughterboard 110A.

Figure 2:
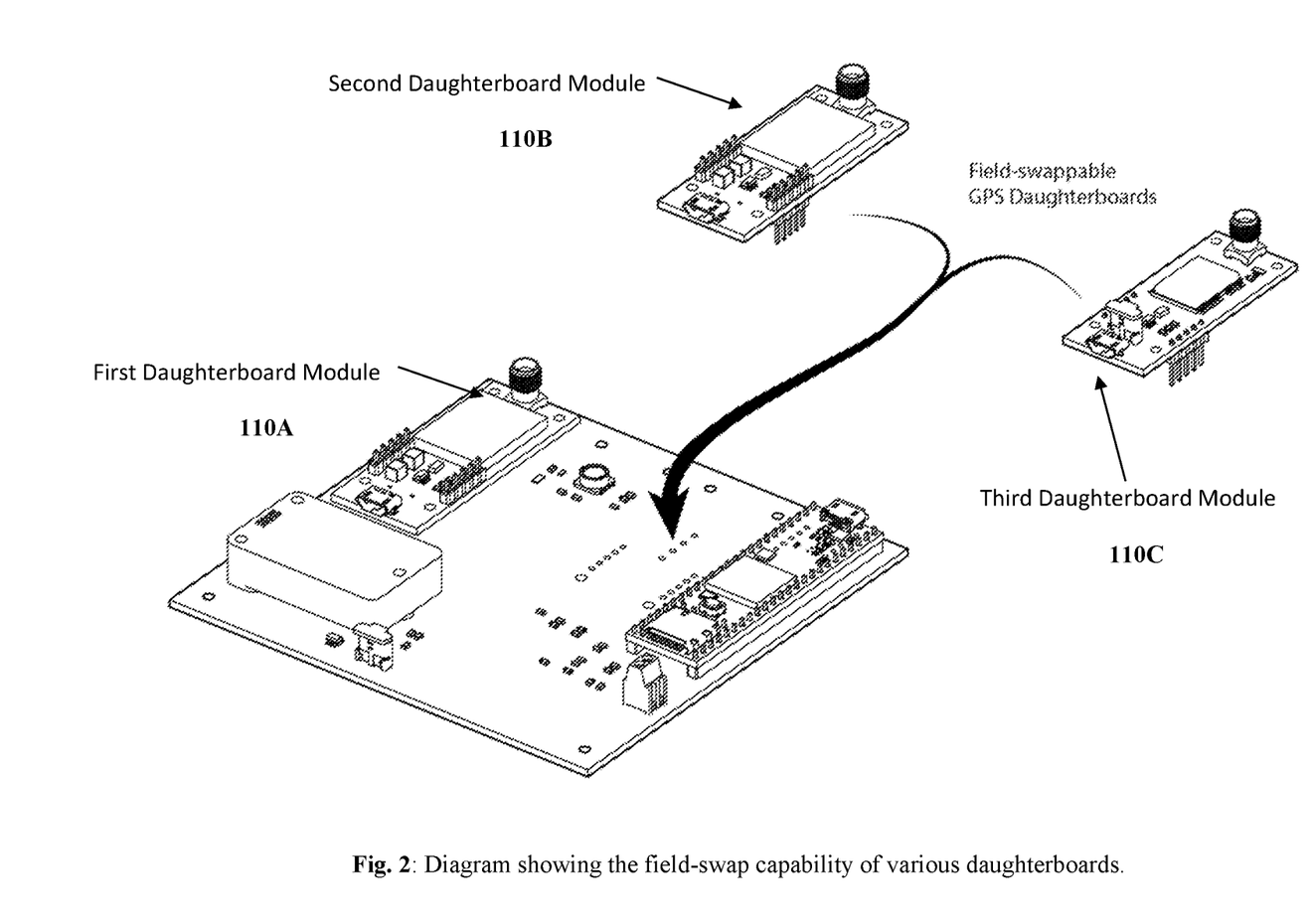
FIG. 2 shows a non-limiting exemplary illustration of a navigational system described herein demonstrating the field-swap capability of various daughterboards.

Per FIG. 2, in another example the navigational system consists of a backplane 100, a modular microcontroller daughterboard 105, an antenna connector 115, a USB connector 120, and an external power input 125, an IMU 300, a first modular daughterboard 110A and at least one of a second modular daughterboard 110B and a third modular daughterboard 110C. In this example, the second modular daughterboard 110B and the third modular daughterboard 110C are field swappable. In some embodiments, the second modular daughterboard 110B can be manually removed and replaced by the third modular daughterboard 110C. In some embodiments, the third modular daughterboard 110C can be manually removed and replaced by the second modular daughterboard 110B.

Figure 3:
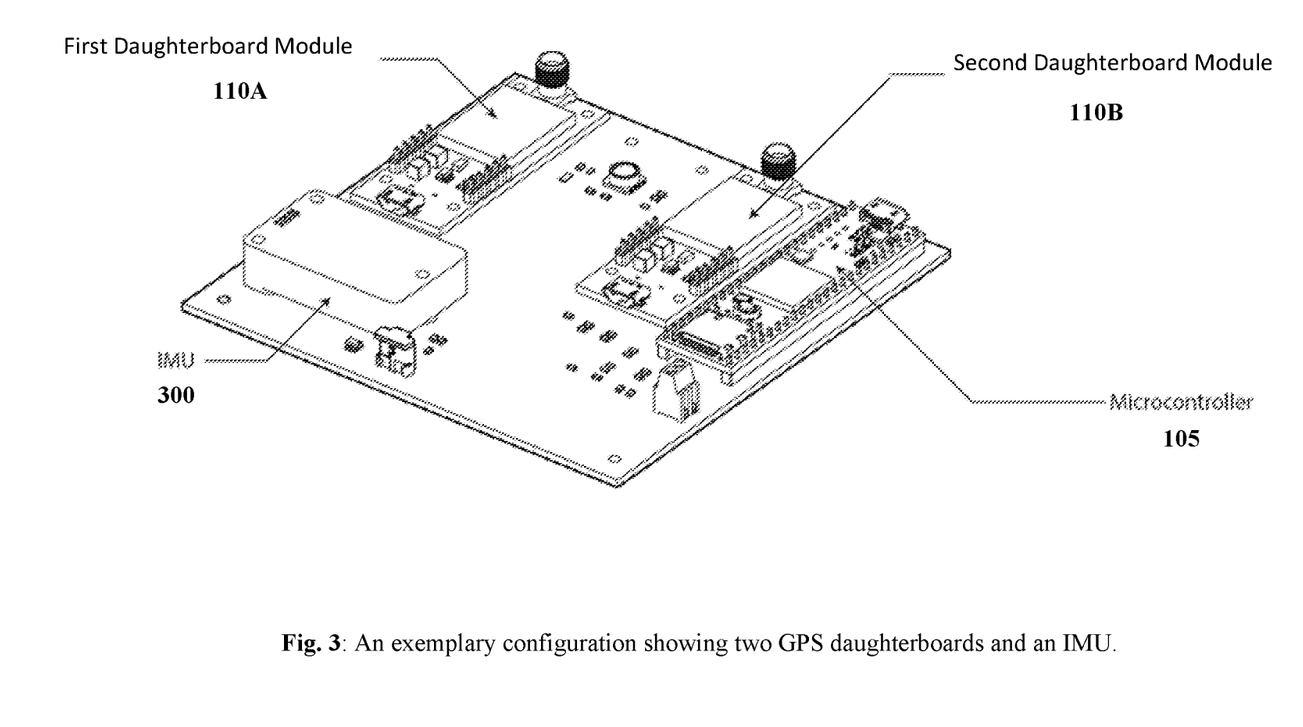
FIG. 3 shows a non-limiting exemplary illustration of a navigational system described herein including a first daughterboard, a second daughterboard, and an IMU.

Per FIG. 3, in another example the navigational system consists of a backplane 100, a modular microcontroller daughterboard 105, an antenna connector 115, a USB connector 120, and an external power input 125, an IMU 300, a first modular daughterboard 110A, and a second modular daughterboard 110B.

Figure 4:
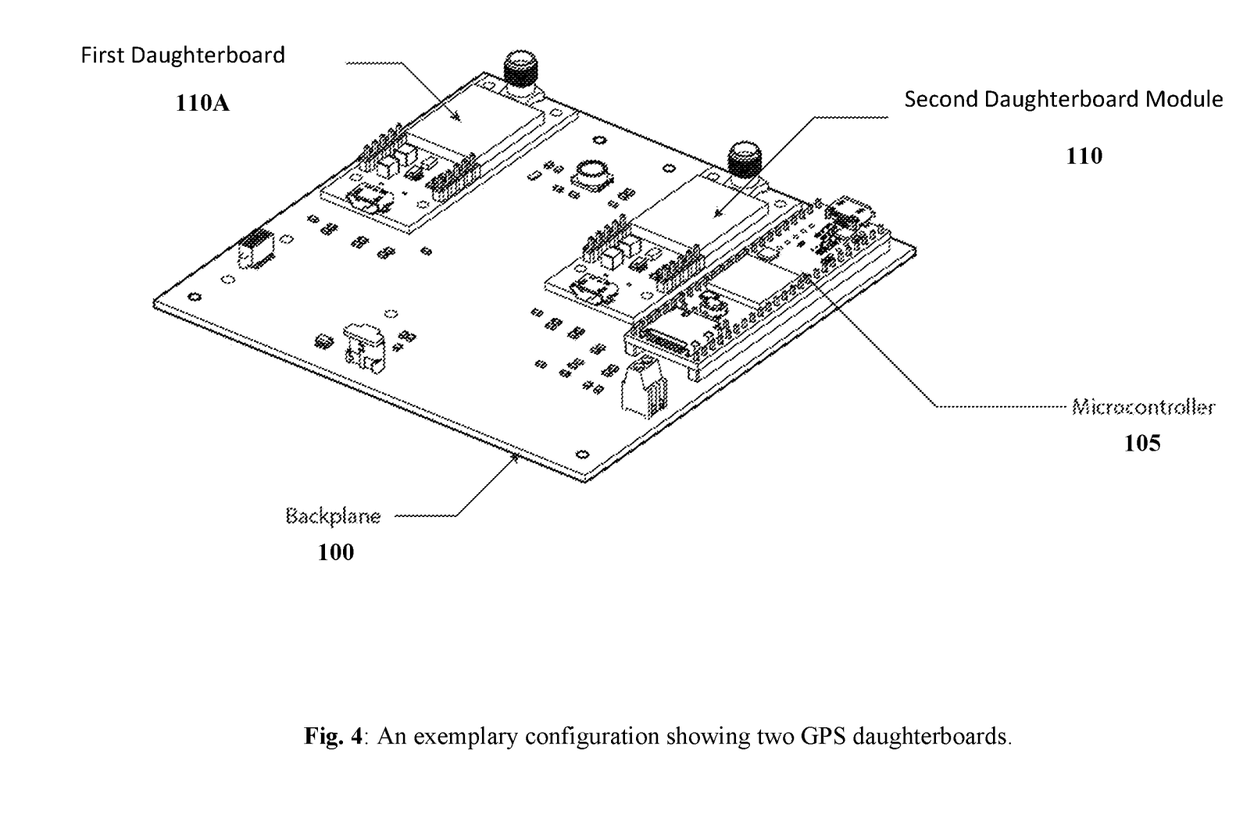
FIG. 4 shows a non-limiting exemplary illustration of a navigational system described herein including a first daughterboard and a second daughterboard.

Per FIG. 4, in another example the navigational system consists of a backplane 100, a modular microcontroller daughterboard 105, an antenna connector 115, a USB connector 120, and an external power input 125, a first modular daughterboard 110A, and a second modular daughterboard 110B.

Figure 5:
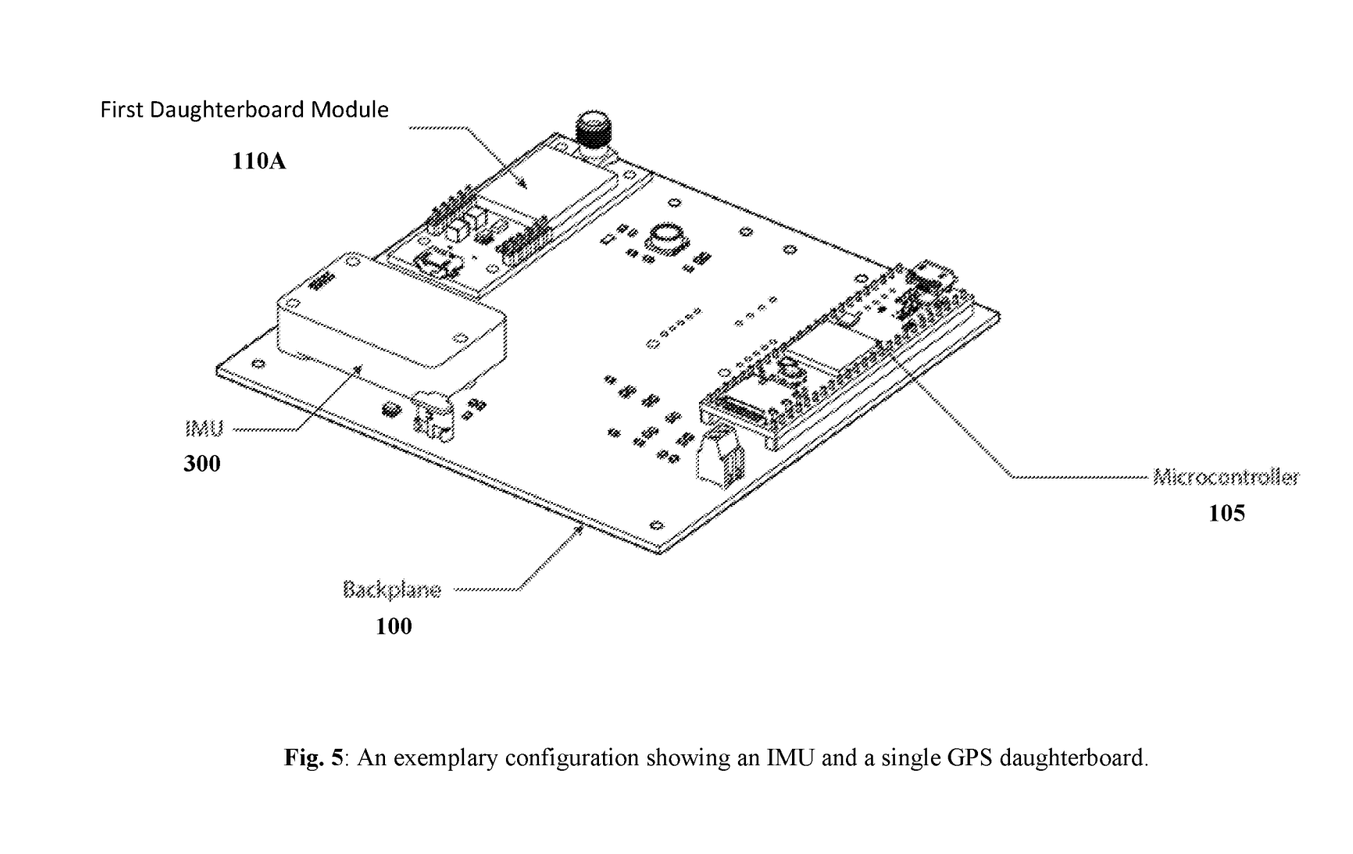
FIG. 5 shows a non-limiting exemplary illustration of a navigational system described herein including an IMU and a single GPS daughterboard.

Per FIG. 5, in another example the navigational system consists of a backplane 100, a modular microcontroller daughterboard 105, an antenna connector 115, a USB connector 120, and an external power input 125, a first modular daughterboard 110A, and an IMU 300.

Vehicles

The systems herein are configured to work on any type of manned or unmanned vehicle operating in a manual, semi-autonomous, or autonomous mode. In some embodiments, the vehicle is an unmanned vehicle. In further embodiments, the unmanned vehicle is a maritime vehicle. In still further embodiments, the unmanned maritime vehicle is a long endurance vehicle. In a particular embodiment, the unmanned maritime vehicle is a surface vehicle. Suitable surface maritime vehicles include, by way of non-limiting examples, ships (e.g., warships, merchant ships, hospital ships, etc.), boats (e.g., commercial boats, recreational boats, sailboats, pontoon boats, house boats, etc.), hovercraft, multi-hulled watercraft (catamarans, trimarans, etc.), airboats, personal watercraft, drones, and the like. In another particular embodiment, the unmanned maritime vehicle is a sub-surface vehicle. Suitable sub-surface maritime vehicles include, by way of non-limiting examples, submarines (e.g., military, commercial, research, etc.), submersibles (e.g., military, commercial, research, etc.), drones, and the like. In other embodiments, the vehicle is a terrestrial vehicle. Suitable terrestrial vehicles include, by way of non-limiting examples, trains, tractor trailers, trams, buses, trucks, vans, ambulances, cars, motorcycles, snow vehicles, construction equipment (e.g., bulldozers, loaders, cranes, backhoes, dump trucks, excavators, dredges, etc.), military vehicles (e.g., armored fighting vehicles, reconnaissance vehicles, light utility vehicles, engineering vehicles, etc.), drones, and the like.

Backplane

In some embodiments, the navigational systems for a vehicle comprise a backplane. The backplane can comprise ports for hosting a plurality of daughterboards, a data connection for receiving data from an inertial measurement unit (IMU), or both. The backplane can be dynamically field-configurable to alter the data connections between the first and second modular daughterboards, the data connections between the first and second modular daughterboards, the modular microcontroller daughterboard, or any combination thereof. In some embodiments, the backplane is implemented as a printed circuit board (PCB). In some embodiments, the backplane comprises pins, fasteners, cables, connectors, or any combination thereof to removably connect to at least one of the IMU, the first modular daughterboard, the second modular daughterboard, or the third modular daughterboard. The connection to the IMU may employ a standardized plug configured to connect to one or more different IMUs. In some embodiments, the backplane comprises pins, fasteners, cables, connectors, or any combination thereof to permanently connect to at least one of the microprocessor, the external power input, or the first modular daughterboard. The backplane can employ a user-serviceable modular architecture to enable mission-specific low-power configurations. Further, the backplane can be configured such that its components are easily removed, replaced, and/or bypassed to further enable continuous operation operate even upon hardware failure.

The backplane can be configured to physically and electrically interconnect one or more of the first modular daughterboard, the second modular daughterboard, and the third modular daughterboard, the IMU, the microprocessor, and the antennas to each other and the vehicle.

The wiring of the backplane can enable automatic default suboptimal operational modes upon failure of any of the components thereon. For example, if one of two GPS elements fails, the backplane can be configured to enable use of the single working GPS element in a degrade mode. Such rugged failover enables continuous vehicle operation over large distances and periods of time, even without human operator intervention.

The backplane can be configured long term uninterrupted use. In some embodiments, the backplane further comprises a high-efficiency power supply configured to power the navigational system for about 2 days to about 300 days of continuous operation. In some embodiments, the high-efficiency power supply is configured to power the navigation system for a period of continuous operation of about 2 days to about 300 days. In some embodiments, the high-efficiency power supply is configured to power the navigation system for a period of continuous operation of about 2 days to about 5 days, about 2 days to about 10 days, about 2 days to about 25 days, about 2 days to about 50 days, about 2 days to about 75 days, about 2 days to about 100 days, about 2 days to about 150 days, about 2 days to about 200 days, about 2 days to about 250 days, about 2 days to about 300 days, about 5 days to about 10 days, about 5 days to about 25 days, about 5 days to about 50 days, about 5 days to about 75 days, about 5 days to about 100 days, about 5 days to about 150 days, about 5 days to about 200 days, about 5 days to about 250 days, about 5 days to about 300 days, about 10 days to about 25 days, about 10 days to about 50 days, about 10 days to about 75 days, about 10 days to about 100 days, about 10 days to about 150 days, about 10 days to about 200 days, about 10 days to about 250 days, about 10 days to about 300 days, about 25 days to about 50 days, about 25 days to about 75 days, about 25 days to about 100 days, about 25 days to about 150 days, about 25 days to about 200 days, about 25 days to about 250 days, about 25 days to about 300 days, about 50 days to about 75 days, about 50 days to about 100 days, about 50 days to about 150 days, about 50 days to about 200 days, about 50 days to about 250 days, about 50 days to about 300 days, about 75 days to about 100 days, about 75 days to about 150 days, about 75 days to about 200 days, about 75 days to about 250 days, about 75 days to about 300 days, about 100 days to about 150 days, about 100 days to about 200 days, about 100 days to about 250 days, about 100 days to about 300 days, about 150 days to about 200 days, about 150 days to about 250 days, about 150 days to about 300 days, about 200 days to about 250 days, about 200 days to about 300 days, or about 250 days to about 300 days. In various embodiments, the high-efficiency power supply is configured to power the navigation system for a period of continuous operation of about 2 days, about 5 days, about 10 days, about 25 days, about 50 days, about 75 days, about 100 days, about 150 days, about 200 days, about 250 days, or about 300 days, including increments therein. In various embodiments, the high-efficiency power supply is configured to power the navigation system for a period of continuous operation of at least about 2 days, about 5 days, about 10 days, about 25 days, about 50 days, about 75 days, about 100 days, about 150 days, about 200 days, or about 250 days, including increments therein.

Microcontroller Daughterboard

In some embodiments, the navigational systems for a vehicle comprises a microcontroller daughterboard. In some embodiments, the modular microcontroller daughterboard and the non-volatile storage are removable and user-swappable.

Modular Daughterboards

In some embodiments, the navigational systems for a vehicle comprises a modular daughterboard. In some embodiments, the navigational systems for a vehicle comprises a first modular daughterboard. In some embodiments, the navigational systems for a vehicle further comprises a second modular daughterboard. In some embodiments, the navigational systems for a vehicle further comprises a third modular daughterboard. In some embodiments, the navigational systems for a vehicle further comprises a fourth, fifth, sixth, or more modular daughterboards. In some embodiments, the navigational systems for a vehicle comprises 1, 2, 3, 4, 5, 6, 7, 8, 9, 10, or more modular daughterboards. In some embodiments, one or more of the modular daughter boards comprises a GPS receiver. In some embodiments, one or more of the modular daughter boards comprises an antenna connector. In some embodiments, the antenna connector comprises a coaxial cable.

In some embodiments, the modular daughterboards are field swappable, wherein one modular daughterboard can be replaced with another modular daughterboard during operation. In some embodiments, the first modular daughterboard is removable and user-swappable. In some embodiments, the second modular daughterboard is removable and user-swappable.

Operational Modes

The systems can provide a plurality of operational modes, wherein the system is field-configurable to switch between operational modes based on remote or programmatic trigger. The plurality of operational modes can comprise two, three, four, five, or all of the following: a first single GPS positioning mode; a second single GPS positioning mode; a differential GPS (dGPS) positioning mode; a single GPS RTK positioning mode; a first dual-receiver GPS RTK positioning mode; and a second dual-receiver GPS RTK positioning mode. In the second single GPS positioning mode a magnetometer of the IMU can be utilized to determine heading. In the single GPS RTK positioning mode, the microcontroller daughterboard can communicate with an external receiver to receive computer real-time kinematic (RTK) fixes. In the first dual-receiver GPS RTK positioning mode, the microcontroller daughterboard can communicate with a self-contained RTK receiving system. In the first dual-receiver GPS RTK positioning mode, a moving baseline system can be established. In the second dual-receiver GPS RTK positioning mode the microcontroller daughterboard can communicate with a RTK system. In the second dual-receiver GPS RTK positioning mode, the IMU can be utilized to supplement the RTK heading by using Kalman filters and high-rate inertial data.

In some embodiments, the first single GPS positioning mode comprises local logging or output to a host system. In some embodiments, the first single GPS positioning mode utilizes assisted GPS (aGPS). In other embodiments, the first single GPS positioning mode utilizes non-assisted GPS. In some embodiments, the second single GPS positioning mode comprises local logging or output to a host system. In some embodiments, the second single GPS positioning mode utilizes aGPS. In other embodiments, the second single GPS positioning mode utilizes non-assisted GPS. In some embodiments, the dGPS positioning mode comprises local logging or output to a host system. In some embodiments, the dGPS positioning mode utilizes aGPS. In other embodiments, the dGPS positioning mode utilizes non-assisted GPS. In some embodiments, the single GPS RTK positioning mode comprises local logging or output to a host system. In some embodiments, the first dual-receiver GPS RTK positioning mode comprises local logging or output to a host system. In some embodiments, the second dual-receiver GPS RTK positioning mode comprises local logging or output to a host system.

While preferred embodiments of the present subject matter have been shown and described herein, it will be obvious to those skilled in the art that such embodiments are provided by way of example only. Numerous variations, changes, and substitutions will now occur to those skilled in the art without departing from the present subject matter. It should be understood that various alternatives to the embodiments of the subject matter described herein may be employed.

What is claimed is:

1. A navigational system for an unmanned maritime vehicle comprising:
   a) a backplane comprising ports for hosting a plurality of daughterboards and a data connection for receiving data from an inertial measurement unit (IMU);
   b) a modular microcontroller daughterboard removably and communicably coupled to the backplane and comprising a microcontroller and a non-volatile storage;
   c) a first modular daughterboard removably and communicably coupled to the backplane and comprising a first GPS RTK receiver; and
   d) a second modular daughterboard removably and communicably coupled to the backplane and comprising a second GPS RTK receiver; and
   e) an inertial measurement unit (IMU) removably and communicably coupled to the data connection of the backplane;

wherein the microcontroller is in communication with hardware components of the system comprising the first GPS RTK receiver, the second GPS RTK receiver, and the IMU, wherein the system provides a plurality of operational modes, wherein the system is field-configurable to switch between the operational modes in a failover cascade based on remote or programmatic triggers, and wherein the plurality of operational modes comprise:
a) a first dual-receiver GPS RTK positioning mode using the first GPS RTK receiver, the second GPS RTK receiver, and the IMU;
b) a second dual-receiver GPS RTK positioning mode using the first GPS RTK receiver and the second GPS RTK receiver;
c) a first single-receiver GPS RTK positioning mode using the first RTK GPS receiver or the second RTK GPS receiver and the IMU; and
d) a second single-receiver GPS RTK positioning mode using the first RTK GPS receiver or the second RTK GPS receiver.

2. The system of claim 1, wherein the unmanned maritime vehicle is a long endurance vehicle.

3. The system of claim 1, wherein the unmanned maritime vehicle is a surface vehicle.

4. The system of claim 1, wherein the backplane is implemented as a printed circuit board (PCB).

5. The system of claim 1, wherein the modular microcontroller daughterboard and the non-volatile storage are field-removable and user-swappable.

6. The system of claim 1, wherein the first modular daughterboard is field-removable and user-swappable.

7. The system of claim 1, wherein the second modular daughterboard is field-removable and user-swappable.

8. The system of claim 1, wherein the IMU is field-removable and user-swappable.

9. The system of claim 1, wherein the first dual-receiver GPS RTK positioning mode comprises local logging or output to a host system.

10. The system of claim 1, wherein the first dual-receiver GPS RTK positioning mode utilizes assisted GPS (aGPS).

11. The system of claim 1, wherein the first dual-receiver GPS RTK positioning mode utilizes non-assisted GPS.

12. The system of claim 1, wherein the second dual-receiver GPS RTK positioning mode comprises local logging or output to a host system.

13. The system of claim 1, wherein the second dual-receiver GPS RTK positioning mode utilizes aGPS.

14. The system of claim 1, wherein the second dual-receiver GPS RTK positioning mode utilizes non-assisted GPS.

15. The system of claim 1, wherein the first single-receiver GPS RTK positioning mode comprises local logging or output to a host system.

16. The system of claim 1, wherein the first single-receiver GPS RTK positioning mode utilizes aGPS.

17. The system of claim 1, wherein the first single-receiver GPS RTK positioning mode utilizes non-assisted GPS.

18. The system of claim 1, wherein the second single-receiver GPS RTK positioning mode comprises local logging or output to a host system.

19. The system of claim 1, further comprising one or more built-in antennas integral to the system.

20. The system of claim 1, further comprising one or more external antennas.

21. The system of claim 1, further comprising an ambient temperature sensor.

22. The system of claim 1, further comprising an ambient pressure sensor.

23. The system of claim 1, implemented as a self-contained unit comprising means for mounting to the vehicle.

24. The system of claim 23, further comprising a waterproof case enclosing the self-contained unit.

25. The system of claim 1, wherein the backplane further comprises a high-efficiency power supply configured to power the navigational system for about 2 days to about 300 days of continuous operation.

26. The system of claim 25, wherein the system operates on a power budget of less than 0.05 amperes at 5 volts.

\* \* \* \* \*